(12) United States Patent
Moore

(10) Patent No.: US 10,264,653 B2
(45) Date of Patent: Apr. 16, 2019

(54) APPARATUS FOR CONTROLLING DRIVER CURRENT FOR ILLUMINATION SOURCE

(71) Applicant: STMICROELECTRONICS (RESEARCH & DEVELOPMENT) LIMITED, Buckinghamshire (GB)

(72) Inventor: John Kevin Moore, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 0 days.

(21) Appl. No.: 15/610,013

(22) Filed: May 31, 2017

(65) Prior Publication Data

US 2018/0103528 A1 Apr. 12, 2018

(30) Foreign Application Priority Data

Oct. 12, 2016 (EP) .................................. 16193533

(51) Int. Cl.
| | | |
|---|---|---|
| *G01S 17/08* | (2006.01) | |
| *H01S 5/042* | (2006.01) | |
| *H01S 5/183* | (2006.01) | |
| *H05B 37/02* | (2006.01) | |
| *H01S 5/0683* | (2006.01) | |

(52) U.S. Cl.
CPC .......... *H05B 37/0227* (2013.01); *G01S 17/08* (2013.01); *H01S 5/042* (2013.01); *H01S 5/183* (2013.01); *H05B 37/0218* (2013.01); *H01S 5/0683* (2013.01)

(58) Field of Classification Search
CPC . H05B 37/0227; H05B 37/0218; H01S 5/042; H01S 5/183
See application file for complete search history.

(56) References Cited

U.S. PATENT DOCUMENTS

| | | | |
|---|---|---|---|
| 2002/0029103 A1 | 3/2002 | Breed et al. | |
| 2012/0051379 A1* | 3/2012 | Wang | H01S 5/042 |
| | | | 372/38.01 |
| 2017/0283088 A1* | 10/2017 | Sabe | B64C 13/18 |

FOREIGN PATENT DOCUMENTS

EP 1511136 A1 3/2005

* cited by examiner

*Primary Examiner* — Dedei K Hammond
*Assistant Examiner* — Raymond R Chai
(74) *Attorney, Agent, or Firm* — Slater Matsil, LLP

(57) ABSTRACT

An apparatus includes an illumination source configured to emit light when driven with a current greater than a threshold current and driver circuitry configured to drive the illumination source with a controllable current. The driver circuit controlled by at least a first input value. At least one illumination detector is configured to detect light emitted by the illumination source and monitor circuitry is configured to receive an output from the illumination detector and provide the first input value.

29 Claims, 5 Drawing Sheets

APPARATUS FOR CONTROLLING DRIVER CURRENT FOR ILLUMINATION SOURCE

CROSS-REFERENCE TO RELATED APPLICATIONS

This application claims priority to European Patent Application No. 16193533.3, filed on Dec. 16, 2016, which application is hereby incorporated herein by reference.

TECHNICAL FIELD

Some embodiments relate to an apparatus and in particular but not exclusively to an apparatus for controlling the driver current for an illumination source.

BACKGROUND

Single photon avalanche diode (SPAD) time of flight sensors typically comprise arrays of single photon avalanche diodes and an illumination source in the form of a vertical cavity surface emitting laser (VCSEL). The vertical cavity surface emitting laser is provided with current by a driver circuit which is typically configured to be able to control the current through the laser in order to produce pulse or other waveform outputs.

Typically the vertical cavity surface emitting laser has a threshold current above which the laser is able to emit light (and similarly below which the laser does not emit anything).

However this threshold current level is not well defined and may change significantly based on many variables such as temperature and process variations.

SUMMARY

Some embodiments relate to an apparatus and, in particular but not exclusively, to an apparatus with an array of photosensitive devices.

According to a first aspect, and apparatus comprises an illumination source configured to emit light when driven with a current greater than a threshold current. Driver circuitry is configured to drive the illumination source with a controllable current. The driver circuit is controlled by at least a first input value. At least one illumination detector is configured to detect light emitted by the illumination source and monitor circuitry is configured to receive an output from the illumination detector and provide the first input value.

The monitor circuitry may comprise an ambient compensator configured to receive the output from the at least one illumination detector and output an ambient compensated value, a parameter determiner configured to determine at least one parameter value to be compared based on the ambient compensated value, a parameter comparator configured to compare the at least one parameter value against at least one threshold value, and an offset generator configured to control the driver circuit to provide the controllable current based on an output from the parameter comparator.

The parameter determiner may be configured to select an ambient compensated minimum intensity value from the at least one illumination detector.

The parameter comparator may be configured to compare the ambient compensated minimum intensity value against a first threshold value, and wherein the offset generator may be configured to control the driver circuit to increase the controllable current where the ambient compensated minimum intensity value is close to or below the first threshold value.

The first threshold value may be zero.

The parameter comparator may be configured to compare the ambient compensated minimum intensity value against a second threshold value, and wherein the offset generator may be configured to control the driver circuit to decrease the controllable current where the ambient compensated minimum intensity value is close to or above the second threshold value.

The second threshold value may be above zero.

The parameter determiner may be configured to determine a ratio of a fundamental frequency signal strength against harmonic frequencies signal strength based on a Fourier analysis of a time sequence of ambient compensated values.

The parameter comparator may be configured to compare the ratio of a fundamental frequency signal strength against harmonic frequencies signal strength against a first threshold value, and wherein the offset generator may be configured to control the driver circuit to increase the controllable current where the ratio of a fundamental frequency signal strength against harmonic frequencies signal strength is close to or below the first threshold value.

The parameter determiner may be configured to determine a ratio of a fundamental frequency signal strength against zero or dc frequency signal strength based on a Fourier analysis of a time sequence of ambient compensated values.

The parameter comparator may be configured to compare the ratio of a fundamental frequency signal strength against zero or dc frequency signal strength against a second threshold value, and wherein the offset generator may be configured to control the driver circuit to decrease the controllable current where the ratio of a fundamental frequency signal strength against zero or dc frequency signal strength is close to or above the second threshold value.

The monitor circuitry may be configured to provide at least one of: the first input value to pre-bias the illumination source operating in a pulsed mode such that the illumination source is driven with a current substantially at the threshold current before the pulse is initiated; and the first input value so to pre-bias the illumination source operating in a time-varying wave mode such that the illumination source responds substantially linearly for any increase in the controllable current.

The illumination source may be at least one of a vertical cavity surface emitting laser (VCSEL) and a light emitting diode.

The apparatus may be a single photon avalanche diode based range detecting sensor, wherein the illumination detector may comprise at least one of: a single photon avalanche diode return array; and a single photon avalanche diode reference array.

According to a second aspect, a method comprises providing an illumination source configured to emit light when driven with a current greater than a threshold current. Driver circuitry drives the illumination source with a controllable current. The driver circuit is controlled by at least a first input value. Light emitted by the illumination source is detected with at least one illumination detector. Monitor circuitry receives the output from illumination detector and controls the first input value.

Controlling the first input value using the monitor circuitry may comprise generating an ambient compensated value based on the received illumination detector output, determining at least one parameter value based on the ambient compensated value, comparing the at least one parameter value against at least one threshold value, and controlling the driver circuit to provide the controllable current based on the comparing.

Determining the at least one parameter value may comprise selecting an ambient compensated minimum intensity value.

Comparing the at least one parameter value against the at least one threshold value may comprise comparing the ambient compensated minimum intensity value against a first threshold value, and controlling the driver circuit to provide the controllable current based on the comparing may comprise controlling the driver circuit to increase the controllable current where the ambient compensated minimum intensity value is close to or below the first threshold value.

The first threshold value may be zero.

Comparing the at least one parameter value against the at least one threshold value may comprise comparing the ambient compensated minimum intensity value against a second threshold value, and wherein controlling the driver circuit to provide the controllable current based on the comparing may comprise controlling the driver circuit to decrease the controllable current where the ambient compensated minimum intensity value is close to or above the second threshold value.

The second threshold value may be above zero.

Determining at least one parameter value based on the ambient compensated value parameter determiner may comprise determining a ratio of a fundamental frequency signal strength against harmonic frequencies signal strength based on a Fourier analysis of a time sequence of ambient compensated values.

Comparing the at least one parameter value against the at least one threshold value may comprise comparing the ratio of a fundamental frequency signal strength against harmonic frequencies signal strength against a first threshold value, and wherein the controlling the driver circuit to provide the controllable current based on the comparing may comprise controlling the driver circuit to increase the controllable current where the ratio of a fundamental frequency signal strength against harmonic frequencies signal strength is close to or below the first threshold value.

Determining at least one parameter value based on the ambient compensated value parameter determiner may comprise determining a ratio of a fundamental frequency signal strength against zero or dc frequency signal strength based on a Fourier analysis of a time sequence of ambient compensated values.

Comparing the at least one parameter value against the at least one threshold value may comprise comparing the ratio of a fundamental frequency signal strength against zero or dc frequency signal strength against a second threshold value, and wherein the controlling the driver circuit to provide the controllable current based on the comparing may comprise controlling the driver circuit to decrease the controllable current where the ratio of a fundamental frequency signal strength against zero or dc frequency signal strength is close to or above the second threshold value.

Controlling the driver circuit to provide the controllable current based on the comparing may comprise providing at least one of: the first input value to pre-bias the illumination source operating in a pulsed mode such that the illumination source is driven with a current substantially at the threshold current before the pulse is initiated; and the first input value so to pre-bias the illumination source operating in a time-varying wave mode such that the illumination source responds substantially linearly for any increase in the controllable current.

The illumination source may be at least one of: a vertical cavity surface emitting laser (VCSEL); and a light emitting diode.

The method may be a method for operating a single photon avalanche diode based range detecting sensor, wherein detecting light emitted by the illumination source with at least one illumination detector may comprise at least one of: detecting light emitted by the illumination source with a single photon avalanche diode return array; and detecting light emitted by the illumination source with a single photon avalanche diode reference array.

BRIEF DESCRIPTION OF THE DRAWINGS

Some embodiments will now be described by way of example only and with reference to the accompanying Figures in which.

DETAILED DESCRIPTION OF ILLUSTRATIVE EMBODIMENTS

The concept as employed herein is to implement and configure a SPAD TOF sensor module and in particular the driver current offset to attempt to set the offset such that it matches the vertical cavity surface emitting laser (VCSEL) threshold current requirements independent on the process parameters or operating parameters of the VCSEL.

As described previously the VCSEL requires a drive current which is above a threshold level in order to produce an output. In order to achieve this, the driver is operated using an offset value.

This offset value can be typically configured to be the value slightly below the level required to cause the driver to provide a current.

The SPAD TOF sensor when operating the laser in a pulse mode, typically requires the VCSEL to be able to switch on and off quickly. The driver is configured to operate like a switch and is not designed with much consideration about the shape of the rise or fall of the switch profile.

Although the switching off of the pulse does not critically depend on the VCSEL threshold (or switch on) current, in order to produce fast switching at higher frequencies the driver can provide an offset such that the VCSEL is either at or very close to the threshold current level. Thus in order to be able to achieve fast switch frequencies the concept as described herein is one in which the VCSEL operations are monitored to determine whether the offset voltage for the drivers is causing the driver to be operated as close as possible to the threshold level value.

SPAD TOF sensors (and also VCSELs) can also be operated to generate a required waveform other than a pulse. In such circumstances the driver may be configured to modulate the drive current such that the VCSEL generates a light intensity output which has a time varying waveform.

An example of a useful time varying waveform is a sine wave. In such examples the driver offset should be designed or configured such that the driver current is at the VCSEL operating threshold value (or minimum operating value) in order that any modulation of the driver circuit produces an effective time varying change in the light intensity. Preferably furthermore the relationship between the time varying light intensity waveform and the driver modulation is linear (or as near as being a linear relationship as possible).

The threshold value of a vertical cavity surface emitting laser is not well defined and can be affected by many different operational parameters. For example it is known that process variations may cause difference between the threshold values in two devices. Furthermore even for a single device the threshold value may vary significantly based on the operating temperature and the supply voltage as well as other characteristics.

Figure 1:
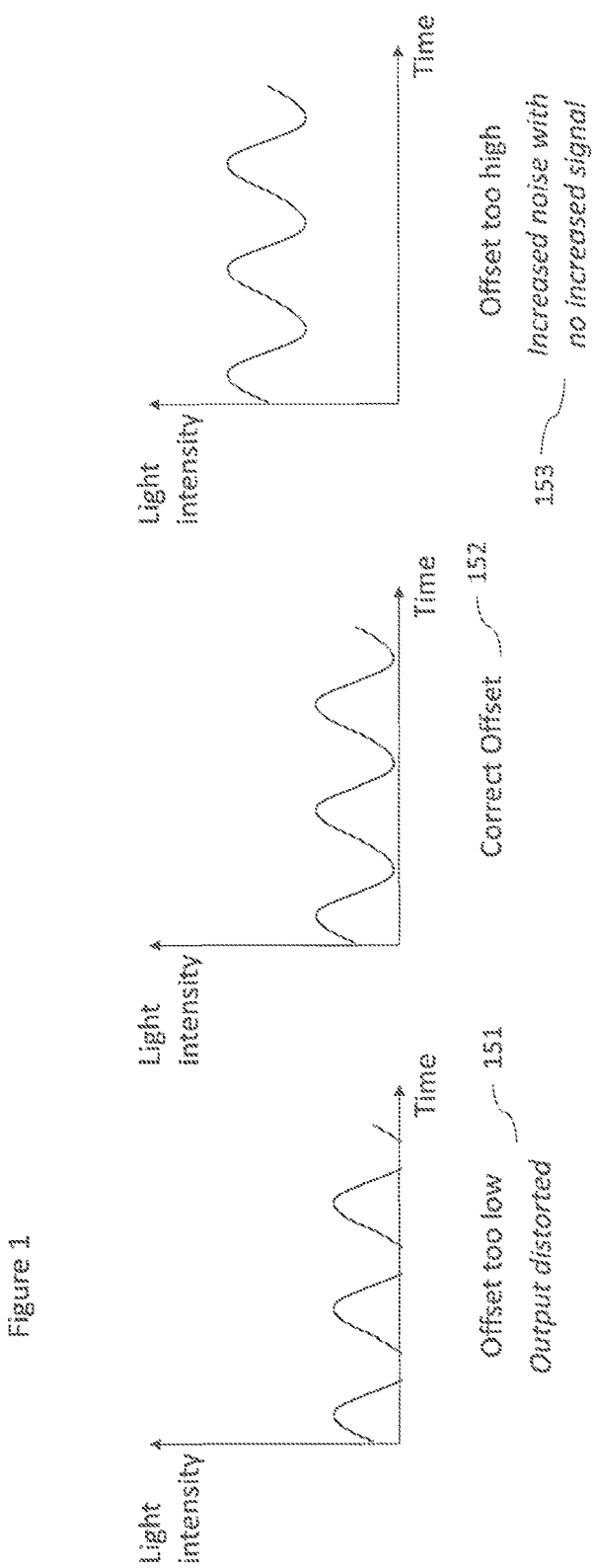
FIG. 1 shows a schematic view of example current drive waveforms with varying levels of offset current applied to the waveform.

FIG. 1 for example shows the effect of operating the VCSEL at offset values which are significantly below the threshold value, at the threshold value and above the threshold value.

For example in order to guarantee that the VCSEL produces a fast and linear response the driver could be operated with the offset value that is significantly above the threshold. However by operating the laser significantly above the threshold there is always a DC (or offset) component added to the light intensity. This increases the noise, from Photon Shot Noise contribution, and thus reduces the signal to noise ratio (at the receiver). This effect is shown in FIG. 1 by the right hand graph 153 of light intensity output against time for a sine wave applied to the high offset value.

However if the offset value is too low then the VCSEL produces a distorted or non-linear response. This is shown in FIG. 1 by the left hand graph 151 of light intensity output against time for a sine wave applied to the low offset value where some of the sine wave signals are clipped.

Where the offset value is about the threshold value then the output represents a linear representation of the input. This is shown in FIG. 1 by the center graph 152 of light intensity output against time for a sine wave which shows a light intensity which is neither clipped nor contains significantly more noise.

The concept of this application as described hereafter is apparatus and methods for monitoring the output intensity of a VCSEL (and using for example suitable SPAD ToF sensor apparatus where possible) in order to tune the offset current such that the offset current matches or takes into account the variability of the threshold current required to operate the driver and drive the light emitting device such as the VCSEL.

Figure 2:
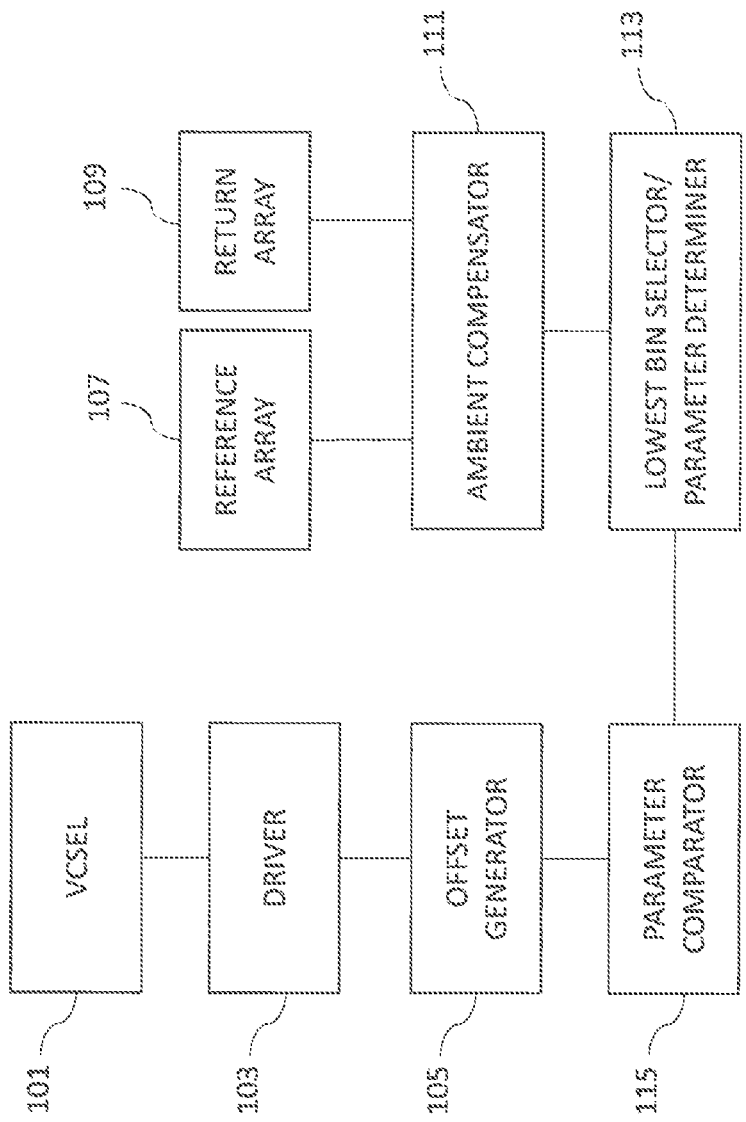
FIG. 2 shows a schematic view of an example apparatus for controlling the driving current according to some embodiments.

With respect to FIG. 2, an example apparatus for implementing the embodiments of the concept is shown. In some embodiments, the apparatus may be a SPAD ToF sensor device.

The apparatus shown comprises a vertical cavity surface emitting laser (VCSEL) 101, which is configured to generate light intensity based on a supplied current (and voltage) provided by a driver 103.

The driver 103 is also configured to generate a current of which a part of is controlled based on an input from an offset generator 105.

The apparatus may be configured such that the output of the VCSEL has an internal (or parasitic path) to a reference array 107. In other words light generated by the VCSEL is internally coupled to a first single photon avalanche diode (SPAD) array, which may provide a reference value of the light intensity generated by the VCSEL.

The apparatus may furthermore be configured such that the output of the VCSEL has an external or free space path to a return array 109. In other words, light generated by the VCSEL may be externally coupled to at least one further single photon avalanche diode (SPAD) array, which may provide a reference value of the light intensity generated by the VCSEL and which has been reflected from an external object.

In the following examples, the reference array 107 is used to produce a reference signal; however, in some embodiments the return array 109 can be used as well as the reference array 107 or instead of the reference array 107. For example, in some embodiments, the apparatus may not have a reference array 107 and use the return array 109 instead to generate the reference signal.

The apparatus may further comprise an ambient compensator 111. The ambient compensator 111 is configured to receive the reference signal from the reference array 107 and/or return array 109 and determine a suitable ambient compensated signal representing the light intensity of the VCSEL. In other words the ambient compensator 111 may be configured to remove any ambient components from the reference signal.

The apparatus may further comprise a lowest bin selector/parameter determiner 113. The lowest bin selector/parameter determiner 113 may be configured to receive the ambient compensated reference signal from the ambient compensator and select a suitable parameter to be output. In some embodiments the suitable parameter is a lowest bin value.

The apparatus may furthermore comprise a parameter comparator 115. The parameter comparator may be configured to receive the parameter (such as the lowest bin value) and compare the parameter against a parameter value (for example, a defined bin value). The output of the comparison may be passed to the offset generator 105 and/or be used to control the output of the offset generator. As described previously, the offset generator 105 is configured to generate an offset value to be supplied to the driver and the feedback loop described herein used to monitor and track the offset voltage to maintain the offset so that the VCSEL is 'on' the threshold value and therefore able to produce light intensity variations which vary in a non-distorted way but without generating a significant dc or offset level.

The ambient compensator 111, the parameter determiner 113, the parameter comparator 115, and the offset generator 105 can be implemented in integrated circuitry, for example, a single integrated circuit chip. The driver 103 could also be implemented on the same chip or may be a separate driver chip. Alternatively, each of the elements can be implemented in a separate integrated circuit or combinations of the elements can be integrated. In one example, a processor is programmed to perform the operations of some or all of the blocks described herein. The program can be stored on a memory that is functionally coupled to the processor, for example, on the same chip as the processor.

Figure 3:
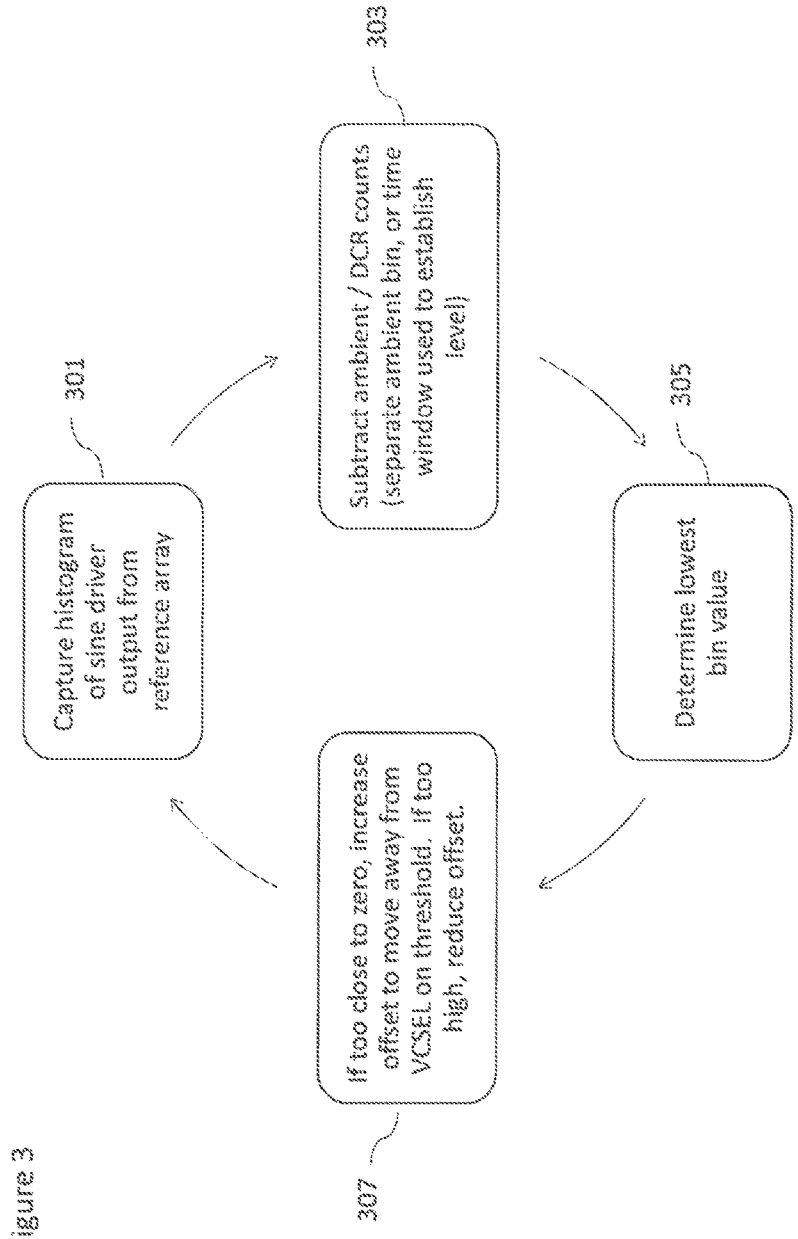
FIG. 3 shows a flow diagram showing the operation of the example apparatus according to a first set of embodiments.

With respect to FIG. 3 the example operation of the apparatus shown in FIG. 2 according to a first set of embodiments is described in further detail. In this example a sine waveform and offset value is generated by the offset generator and which via the driver causes the VCSEL to generate a time varying light intensity. The reference array may capture a histogram of the light intensity associated with the time varying sine wave driver output.

The operation of capturing the histogram of the sine driver output from the reference array is shown in FIG. 3 by step 301.

The ambient compensator can then subtract ambient (or dark count rate) counts using a separate ambient bin, or by using a time window to establish the ambient level.

The operation of generating the ambient compensated value is shown in FIG. 3 by step 303.

The lowest bin selector can then determine and select the lowest bin value. In other words it can select and output the minimum detected intensity value associated with the minimum value of the sine wave and thus reflects the offset value.

The operation of determining the lowest bin value is shown in FIG. 3 by step 305.

The parameter comparator than can compare the lowest bin value against a desired level value. For example the desired level value may be a zero value. In such embodiments where the lowest bin value gets too close to the zero value the comparator may control the offset generator to increase the threshold value and thus move the VCSEL away from the threshold on level. Similarly where the lowest bin value is too high and or above a predetermined value the offset generator may be configured to reduce the offset current.

The operation of comparing the lowest bin value with the zero value and controlling the offset value based on the comparison is shown in FIG. 3 by step 307. In some embodiments the operation may then repeat the steps in order to maintain the monitoring of the offset current value. Although the example shown above (and the examples shown below) describe a simple single threshold value comparison and control mechanism it is understood that any suitable tracking method may be employed to monitor the output of the VCSEL and maintain the operation of the VCSEL within a closely defined range. Thus for example more than one threshold value may be employed to track and control the output and/or a hysteresis range defined between two values to prevent continuous changes in the offset value.

Figure 4:
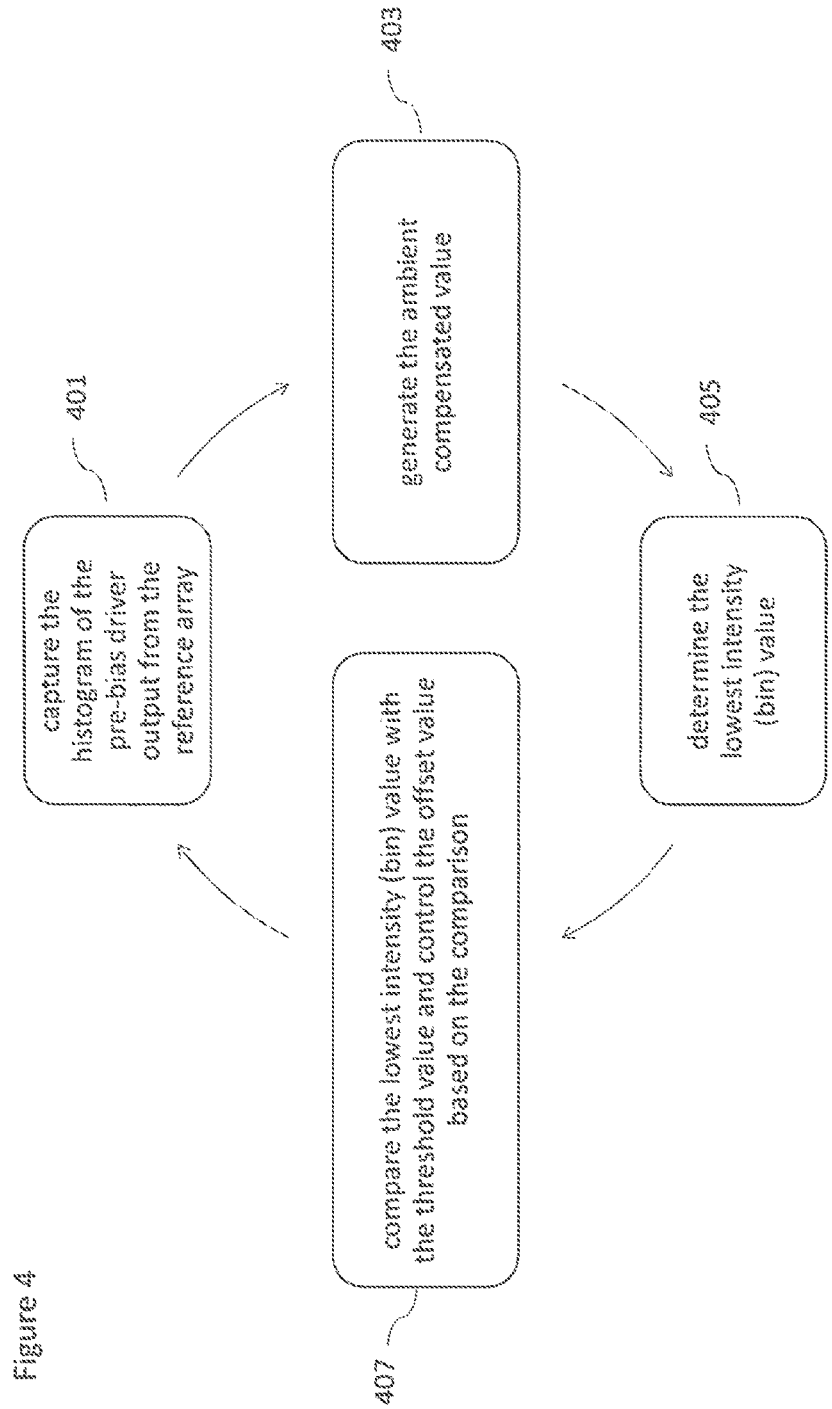
FIG. 4 shows a flow diagram showing the operation of the example apparatus according to a second set of embodiments.

FIG. 4 shows a similar method to FIG. 3 but with respect to the pulse generation mode of operation. Thus in the example shown in FIG. 4 rather than using a sine wave and offset signal for the driver a pre-bias offset value only is used. The pre-bias offset value is generated by the offset generator and which via the driver may cause the VCSEL to generate a visible output. The reference array may capture a histogram of the light intensity associated with the pre-bias driver output.

The operation of capturing the histogram of the pre-bias driver output from the reference array is shown in FIG. 4 by step 401.

The ambient compensator can then subtract ambient (or dark count rate) counts using a separate ambient bin, or by using a time window to establish the ambient level.

The operation of generating the ambient compensated value is shown in FIG. 4 by step 403.

The parameter determiner can then determine and select a value for comparison. For example the value for comparison which may be selected may be the minimum bin value as we are attempting to control the pre-bias value to be just below the threshold value. However in some embodiments the minimum bin value or some average bin value may be used.

The operation of determining the lowest bin value is shown in FIG. 4 by step 405.

The parameter comparator than can compare the lowest bin value against at least one desired level value. For example the desired level value may be a value close to but not equal to zero. In such embodiments where the lowest bin value is greater than the value then the comparator may control the offset generator to decrease the pre-bias value and thus control the VCSEL to operate at about the threshold on level. Similarly where the lowest bin value is lower than the value then the offset generator may be configured to increase the pre-bias level.

The operation of comparing the lowest bin value with the threshold value and controlling the offset value based on the comparison is shown in FIG. 4 by step 407. In some embodiments the operation may then repeat the steps in order to maintain the monitoring of the pre-bias offset current value.

Figure 5:
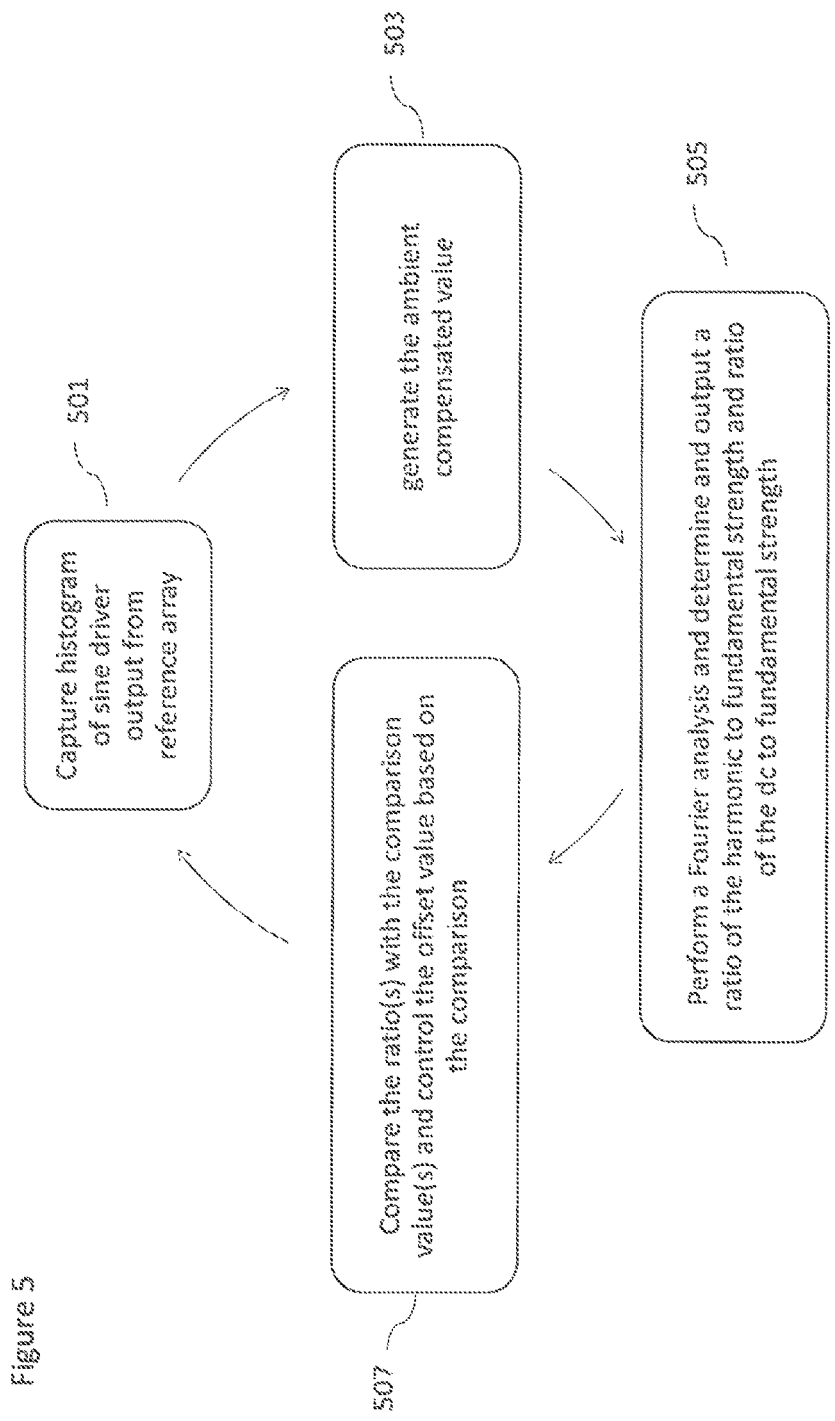
FIG. 5 shows a flow diagram showing the operation of the example apparatus according to a third set of embodiments.

FIG. 5 furthermore shows a similar method to the operations shown in FIG. 3 where the time varying waveform is a sine wave with an offset component, but where the determined or selected parameter is based on a Fourier analysis of the (ambient compensated) reference array signal. The use of Fourier analysis enables the determination of harmonic strength away from the fundamental. In such an embodiment, the offset may be controlled such that it is increased where the distortion level is too high.

In this example a sine waveform and offset value is generated by the offset generator and which via the driver causes the VCSEL to generate a time varying light intensity. The reference array may capture a histogram of the light intensity associated with the time varying sine wave driver output.

The operation of capturing the histogram of the sine driver output from the reference array is shown in FIG. 5 by step 501.

The ambient compensator can then subtract ambient (or dark count rate) counts using a separate ambient bin, or by using a time window to establish the ambient level.

The operation of generating the ambient compensated value is shown in FIG. 5 by step 503.

The parameter selector may than apply a Fourier transform to the ambient compensated values and furthermore determine, a fundamental frequency strength, harmonic frequency strength (and furthermore in some embodiments dc or zero frequency strength). A ratio of the harmonic to fundamental strength may then be generated to the comparator. In some embodiments a ratio of the dc to fundamental strength may also be generated and passed to the comparator.

The operation of performing a Fourier analysis and determination and outputting the ratio(s) is shown in FIG. 5 by step 505.

The parameter comparator than can compare the ratio(s) against desired level values and the results of the comparison used to control the offset value. For example when the ratio of harmonic to fundamental frequency increases it represents a situation where the sine wave is being distorted as the VCSEL is operating with an offset which is too low to allow non-distorted responses and thus the offset may be increased. Similarly when the ratio of the dc to fundamental frequency strength increases it represents a situation where the offset component is too high and thus the offset may be decreased.

The operation of comparing the ratio(s) with the comparison value(s) and controlling the offset value based on the comparison is shown in FIG. 5 by step 507. In some embodiments the operation may then repeat the steps in order to maintain the monitoring of the offset current value.

Some embodiments may use other sensors, instead of SPADs. These sensors may be integrating photo-sensitive elements capable of receiving light intensity, time of arrival, frequency or phase or amplitude/intensity modulation, wavelength (color) or other information.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. An apparatus comprising:
   an illumination source configured to emit light when driven with a current greater than a threshold current;
   a driver circuit configured to drive the illumination source with a controllable current, the driver circuit controlled by a first input value;
   an illumination detector configured to detect light emitted by the illumination source, wherein the apparatus is a single photon avalanche diode based range detecting sensor, and wherein the illumination detector comprises a single photon avalanche diode array; and
   monitor circuitry configured to receive an output from the illumination detector and provide the first input value.

2. The apparatus as claimed in claim 1, wherein the monitor circuitry comprises:
   an ambient compensator configured to receive the output from the illumination detector and to output an ambient compensated value;
   a parameter determination circuit configured to determine a parameter value to be compared based on the ambient compensated value;
   a parameter comparator configured to compare the parameter value against at least one threshold value; and
   an offset generator configured to control the driver circuit to provide the controllable current based on an output from the parameter comparator.

3. The apparatus as claimed in claim 2, wherein the parameter determination circuit is configured to select an ambient compensated minimum intensity value from the illumination detector.

4. The apparatus as claimed in claim 3, wherein the parameter comparator is configured to compare the ambient compensated minimum intensity value against a first threshold value, and wherein the offset generator is configured to control the driver circuit to increase the controllable current when the ambient compensated minimum intensity value is below the first threshold value.

5. The apparatus as claimed in claim 4, wherein the first threshold value is zero.

6. The apparatus as claimed in claim 4, wherein the parameter comparator is configured to compare the ambient compensated minimum intensity value against a second threshold value, and wherein the offset generator is configured to control the driver circuit to decrease the controllable current when the ambient compensated minimum intensity value is above the second threshold value.

7. The apparatus as claimed in claim 6, wherein the second threshold value is above zero.

8. The apparatus as claimed in claim 2, wherein the parameter determination circuit is configured to determine a ratio of a fundamental frequency signal strength against harmonic frequencies signal strength based on a Fourier analysis of a time sequence of ambient compensated values.

9. The apparatus as claimed in claim 8, wherein the parameter comparator is configured to compare the ratio of a fundamental frequency signal strength against harmonic frequencies signal strength against a first threshold value, and wherein the offset generator is configured to control the driver circuit to increase the controllable current where the ratio of a fundamental frequency signal strength against harmonic frequencies signal strength is close to or below the first threshold value.

10. The apparatus as claimed in claim 8, wherein the parameter determination circuit is configured to determine a ratio of a fundamental frequency signal strength against zero or dc frequency signal strength based on a Fourier analysis of a time sequence of ambient compensated values.

11. The apparatus as claimed in claim 10, wherein the parameter comparator is configured to compare the ratio of a fundamental frequency signal strength against zero or dc frequency signal strength against a second threshold value, and wherein the offset generator is configured to control the driver circuit to decrease the controllable current where the ratio of a fundamental frequency signal strength against zero or dc frequency signal strength is close to or above the second threshold value.

12. The apparatus as claimed in claim 1, wherein the monitor circuitry is configured to provide the first input value to pre-bias the illumination source operating in a pulsed mode such that the illumination source is driven with a current substantially at the threshold current before a pulse is initiated.

13. The apparatus as claimed in claim 1, wherein the monitor circuitry is configured to provide the first input value to pre-bias the illumination source operating in a time-varying wave mode such that the illumination source responds essentially linearly for any increase in the controllable current.

14. The apparatus as claimed in claim 1, wherein the illumination source comprises a vertical cavity surface emitting laser (VCSEL) or a light emitting diode.

15. The apparatus as claimed in claim 1, wherein the single photon avalanche diode array comprises a single photon avalanche diode reference array coupled internally to an output of the illumination source.

16. The apparatus as claimed in claim 1, wherein the single photon avalanche diode array comprises a single photon avalanche diode return array coupled externally to an output of the illumination source.

17. A method comprising:
   providing an illumination source configured to emit light when driven with a current greater than a threshold current;
   using driver circuitry to drive the illumination source with a controllable current, the driver circuit controlled by at least a first input value;
   detecting light emitted by the illumination source with an illumination detector; and
   receiving a signal from the illumination detector;
   determining an ambient compensated value from the received signal;
   determining a parameter value to be compared based on the ambient compensated value by selecting an ambient compensated minimum intensity value; and
   controlling the first input value based on the parameter value.

18. An apparatus comprising:
an illumination source;
a driver circuit coupled to drive the illumination source with a controllable current;
an illumination detector configured to detect light emitted by the illumination source; and
a processor coupled to an output of the illumination detector and an input of the driver circuit, wherein the processor is programmed to:
determine an ambient compensated value from the illumination detector;
determine a parameter value to be compared based on the ambient compensated value by selecting an ambient compensated minimum intensity value;
compare the parameter value against a threshold value; and
control the driver circuit to provide the controllable current based on a result of comparing the parameter value against the threshold value.

19. The apparatus as claimed in claim 18, wherein the processor is programmed to compare the ambient compensated minimum intensity value against a first threshold value, and to control the driver circuit to increase the controllable current when the ambient compensated minimum intensity value is below the first threshold value.

20. The apparatus as claimed in claim 19, wherein the processor is programmed to compare the ambient compensated minimum intensity value against a second threshold value, and wherein to control the driver circuit to decrease the controllable current when the ambient compensated minimum intensity value is above the second threshold value.

21. The apparatus as claimed in claim 20, wherein the first threshold value is zero and the second threshold value is above zero.

22. The apparatus as claimed in claim 18, wherein the processor is programmed to determine a ratio of a fundamental frequency signal strength against harmonic frequencies signal strength based on a Fourier analysis of a time sequence of ambient compensated values.

23. The apparatus as claimed in claim 22, wherein the processor is programmed to compare the ratio of a fundamental frequency signal strength against harmonic frequencies signal strength against a first threshold value, and to control the driver circuit to increase the controllable current where the ratio of a fundamental frequency signal strength against harmonic frequencies signal strength is close to or below the first threshold value.

24. The apparatus as claimed in claim 22, wherein the processor is programmed to determine a ratio of a fundamental frequency signal strength against zero or dc frequency signal strength based on a Fourier analysis of a time sequence of ambient compensated values.

25. The apparatus as claimed in claim 24, wherein the processor is programmed to compare the ratio of a fundamental frequency signal strength against zero or dc frequency signal strength against a second threshold value, and to control the driver circuit to decrease the controllable current where the ratio of a fundamental frequency signal strength against zero or dc frequency signal strength is close to or above the second threshold value.

26. An apparatus comprising:
an illumination source configured to emit light when driven with a current greater than a threshold current;
a driver circuit configured to drive the illumination source with a controllable current, the driver circuit controlled by a first input value;
an illumination detector configured to detect light emitted by the illumination source; and
monitor circuitry configured to
receive an output from the illumination detector,
select an ambient compensated minimum intensity value of the output received from the illumination detector, and
provide the first input value based on the ambient compensated minimum intensity value.

27. The apparatus of claim 26, wherein the monitor circuitry comprises:
an ambient compensator configured to receive the output from the illumination detector and to output an ambient compensated value;
a parameter determination circuit configured to determine a parameter value to be compared based on the ambient compensated value, wherein the parameter determination circuit is configured to select the ambient compensated minimum intensity value from the illumination detector;
a parameter comparator configured to compare the parameter value against at least one threshold value; and
an offset generator configured to control the driver circuit to provide the controllable current based on an output from the parameter comparator.

28. The apparatus as claimed in claim 27, wherein the parameter comparator is configured to compare the ambient compensated minimum intensity value against a first threshold value, and wherein the offset generator is configured to control the driver circuit to increase the controllable current when the ambient compensated minimum intensity value is below the first threshold value.

29. The apparatus as claimed in claim 28, wherein the parameter comparator is configured to compare the ambient compensated minimum intensity value against a second threshold value, and wherein the offset generator is configured to control the driver circuit to decrease the controllable current when the ambient compensated minimum intensity value is above the second threshold value.

* * * * *